United States Patent
Lee et al.

(10) Patent No.: US 8,253,059 B2
(45) Date of Patent: Aug. 28, 2012

(54) APPARATUS AND METHOD OF CLEANING SUBSTRATE

(75) Inventors: Se-Won Lee, Chungcheongnam-do (KR); Jae-Jeong Jeong, Chungcheongnam-do (KR); Jung-Gun Cho, Seoul (KR)

(73) Assignee: Semes Co., Ltd. (KR)

( * ) Notice: Subject to any disclaimer, the term of this patent is extended or adjusted under 35 U.S.C. 154(b) by 694 days.

(21) Appl. No.: 12/273,076

(22) Filed: Nov. 18, 2008

(65) Prior Publication Data

US 2009/0277471 A1  Nov. 12, 2009

(30) Foreign Application Priority Data

May 6, 2008 (KR) .................. 10-2008-0041876

(51) Int. Cl.
 B23K 26/00 (2006.01)
 B23K 26/02 (2006.01)

(52) U.S. Cl. .................. 219/121.61; 219/121.68; 134/1; 134/1.3

(58) Field of Classification Search .............. 219/121.6, 219/121.85, 121.86, 121.61, 121.67–121.72; 118/720, 730, 641, 900; 134/1.3, 902
See application file for complete search history.

(56) References Cited

U.S. PATENT DOCUMENTS

| | | | |
|---|---|---|---|
| 4,115,683 A * | 9/1978 | Clark et al. | 219/121.7 |
| 5,023,424 A * | 6/1991 | Vaught | 219/121.6 |
| 6,018,383 A * | 1/2000 | Dunn et al. | 355/49 |
| 6,734,388 B2 * | 5/2004 | Lee et al. | 219/121.68 |
| 7,109,503 B1 * | 9/2006 | Bowering et al. | 250/503.1 |
| 2002/0170892 A1 | 11/2002 | Lee et al. | |

FOREIGN PATENT DOCUMENTS

| | | | |
|---|---|---|---|
| JP | 09302461 A | * | 11/1997 |
| JP | 10026699 A | * | 1/1998 |
| JP | 2000-061414 A | | 2/2000 |
| JP | 2003-007655 A | | 1/2003 |
| JP | 2006-142379 A | | 6/2006 |
| JP | 2007111682 A | * | 5/2007 |
| KR | 10-0328620 B1 | | 3/2002 |
| KR | 10-0348701 B1 | | 8/2002 |
| KR | 100797787 B1 | | 1/2008 |
| KR | 100873332 B1 | | 12/2008 |

OTHER PUBLICATIONS

Note: The two (2) Korean references were cited in a Notice of Allowance issued by the KIPO on May 7, 2010 in the corresponding Korean patent application. The U.S. published patent application was cited in a first Office Action issued Apr. 14, 2010 in the corresponding Chinese patent application.

* cited by examiner

Primary Examiner — Samuel M Heinrich
(74) Attorney, Agent, or Firm — Charter IP LLC; Matthew J. Lattig

(57) ABSTRACT

A substrate cleaning apparatus includes a supporting plate supporting a substrate and a shielding unit that is disposed above the substrate to protect the substrate. A portion of the shielding unit, which is adjacent to a focal point where light for generating shock waves is focused, is switched. Therefore, the substrate cleaning apparatus prevents the concentration of plumes and residence beams, which are generated together with the shock waves, on a specific region of the shielding unit and further prevents the recontamination of the substrate by the damage of the shielding unit.

9 Claims, 9 Drawing Sheets

APPARATUS AND METHOD OF CLEANING SUBSTRATE

CROSS-REFERENCE TO RELATED APPLICATIONS

This U.S. non-provisional patent application claims priority under 35 U.S.C. §119 of Korean Patent Application No. 2008-0041876 filed on May 6, 2008, the entire contents of which are hereby incorporated by reference.

BACKGROUND OF THE INVENTION

The present invention described herein relates to a semiconductor manufacturing equipment and, more particularly, to an apparatus and method of cleaning a substrate using a laser shock wave.

Generally, a semiconductor substrate is manufactured through a thin film deposition process, an etching process, and a cleaning process. Particularly, the cleaning process removes residence materials or particles that are created during the manufacturing process of the semiconductor substrate.

The cleaning process may be classified into wet cleaning and dry cleaning. The wet cleaning cleans the substrate using chemical agents. A large amount of the chemical agents used in the wet cleaning causes the environment contamination. In addition, the wet cleaning has limitations in that the work speed is low and a size of the equipment is large.

Meanwhile, the dry cleaning cleans the substrate using plasma or laser without damaging the substrate. The dry cleaning using the plasma cleans the substrate by allowing radical to act with polluting materials on a surface of the substrate. The dry cleaning using the laser removes foreign substances on the surface of the substrate without damaging the substrate by applying laser shock waves.

In more detail, the dry cleaning using the laser focuses laser beams to generate the shock waves above the substrate and the foreign substances are removed by the shock waves. However, when the shock waves are generated, plums or residence beams are generated together with the shock waves. The plums or residence beams cause the damage of the substrate.

In order to avoid the above limitations, a mask is disposed above the substrate to prevent the plums or residence beams from being incident on the substrate. However, when cleaning the substrate, only the substrate rotates with a focal point of the laser and the mask fixed and thus the plums and residence beams are continually incident on a specific portion of the mask. This results in the damage of the mask and splinters of the mask fall down on the substrate to contaminate the substrate.

SUMMARY OF THE INVENTION

The present invention provides a substrate cleaning apparatus that can prevent recontamination of the substrate in the course of cleaning.

The present invention also provides a substrate cleaning method using the substrate cleaning apparatus.

Embodiments of the present invention provide substrate cleaning apparatuses include a supporting plate, a beam generator, a lens, and a shielding unit.

The supporting plate supports a substrate and is able to rotate. The beam generator emits light for generating shock waves cleaning the substrate. The lens focuses the light emitted from the beam generator above the substrate. The shielding unit protects the substrate between a focal point of the lens and the substrate. A portion of the shielding unit, which is adjacent to the focal point, is switched.

In some embodiments, the shielding unit may include a mask and a moving unit. The mask may be oppositely disposed above the substrate and cover a part of the substrate when viewed from a top plane. The moving unit may be coupled to the mask and move the mask.

In other embodiments of the present invention, substrate cleaning apparatuses include a supporting unit and a cleaning unit.

The supporting unit supports a substrate. The cleaning unit generates shock waves for cleaning the substrate and directs the shock waves to the substrate. At this point, the cleaning unit may include a shock wave generator and a mask. The shock wave generator generates the shock waves above the substrate using laser beams. The mask faces the substrate between a focal point at which the laser beams are focused and the substrate.

In still other embodiments of the present invention, substrate cleaning methods include: disposing a substrate on a supporting plate; disposing a mask above the substrate; focusing light at a point adjacent the mask to generate shock waves above the substrate; and cleaning the substrate using the shock waves while switching a portion of the mask, which is adjacent to a focal point where the light is focused.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings.

Figure 1:
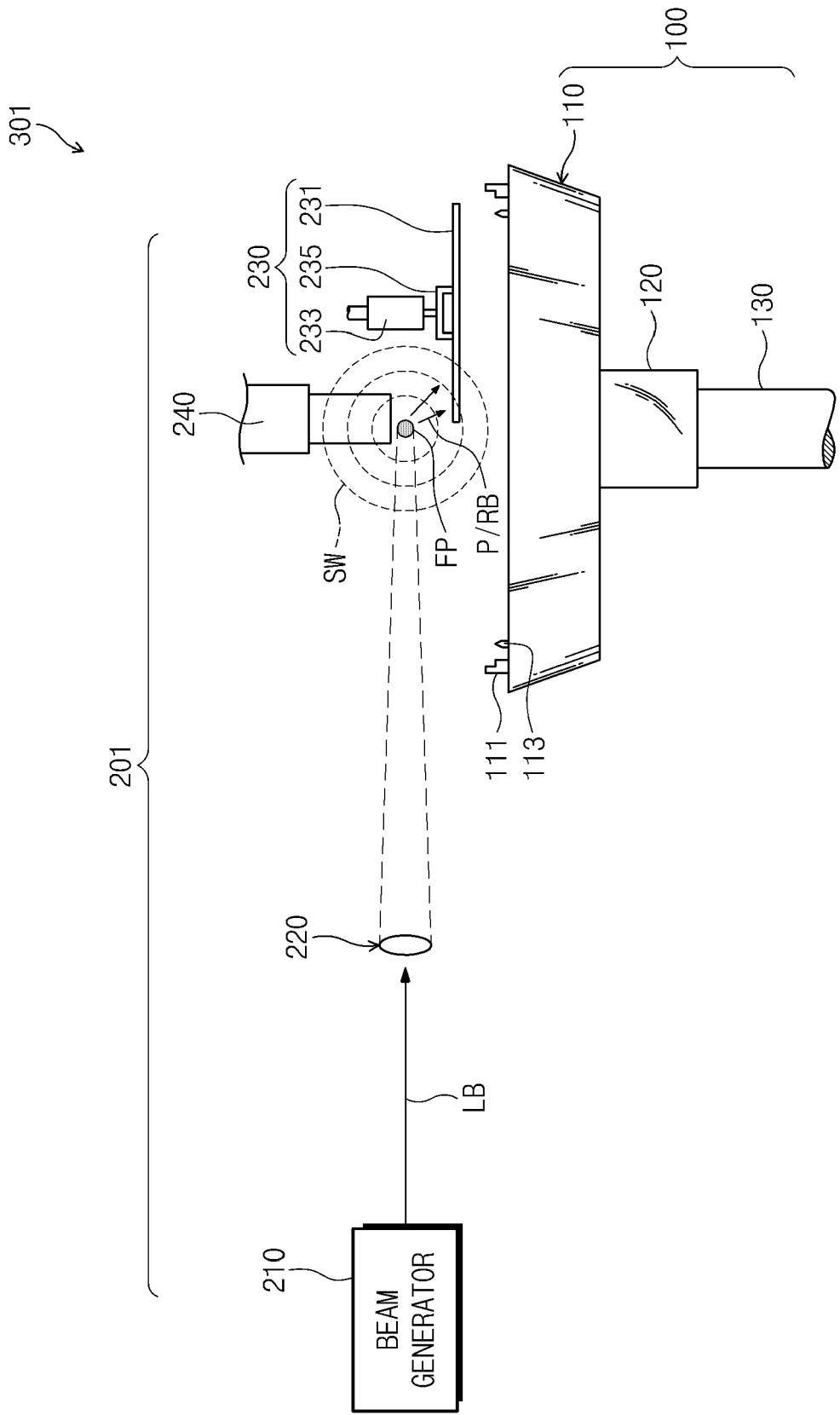
FIG. 1 is a schematic view of a substrate cleaning apparatus according to an embodiment of the present invention.
Figure 2:
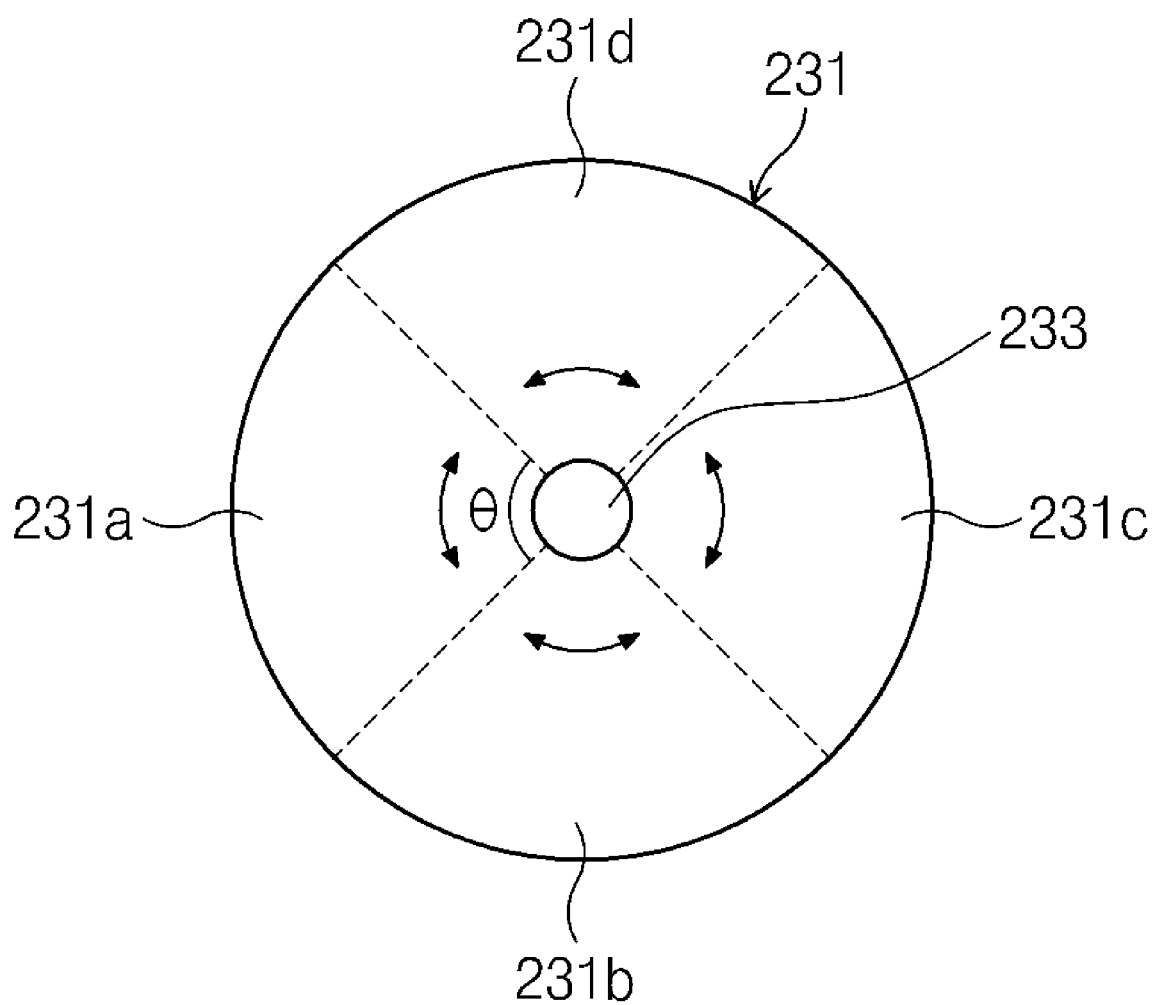
FIG. 2 is a top plane view of a shielding member depicted in FIG. 1.

FIG. 1 is a schematic view of a substrate cleaning apparatus according to an embodiment of the present invention and FIG. 2 is a top plane view of a shielding member depicted in FIG. 1.

Referring to FIG. 1, a substrate cleaning apparatus 301 in accordance with an embodiment includes a supporting unit 100 supporting a substrate and a cleaning unit 201 applying shock waves for cleaning the substrate.

In more detail, the supporting unit 100 may include a supporting plate 110, a rotational shaft 120, and a stationary shaft 130. The supporting plate 110 is formed in a disk shape and the substrate is disposed on a top surface of the supporting plate 110. At this point, a rear surface of the substrate faces the supporting plate 110. In addition, the supporting plate 110 may include a plurality of chucking pins 111 and a plurality of supporting pins 113. The chucking pins 111 are provided on a top surface of the supporting plate 110 to fixedly support an outer circumference of the substrate. The supporting pins 113 are positioned at an internal side with respect to the chucking pins 111 to support an edge of an undersurface of the substrate.

The rotational shaft 120 and the stationary shaft 130 are installed under the supporting plate 110. The rotational shaft 120 is coupled to the supporting plate 110 and connected to an external driving unit (not shown) to rotate. Torque (rotational force) of the rotational shaft 120 is transferred to the supporting plate and the supporting plate 110 rotates together with the rotational shaft 120. The rotational shaft 120 is coupled to the stationary shaft 130. The stationary shaft 130 has a first end portion coupled to the rotational shaft 120 and supports the rotational shaft 120. However, the stationary shaft 130 does not rotate together with the rotational shaft 120.

Meanwhile, the cleaning unit 201 generates the shock waves SW above the supporting plate 110 to clean the substrate.

Referring to FIGS. 1 and 2, the cleaning unit 201 includes a beam generation unit 210, a lens 220, and a shielding unit 230. The beam generation unit 210 generates the laser beams and directs the laser beams to the lens 220. The lens 220 focuses the laser beams LB on the supporting plate 110. Accordingly, the shock waves are generated above the supporting plate 110. The shock waves are propagated in every direction with reference to a focal point FP on which the laser beams are focused and collide with the surface of the substrate 10 to remove the foreign substances from the substrate.

In one embodiment, the focal point FP of the lens 220 is located at a central portion of the supporting plate 110 and fixed during the cleaning of the substrate.

Meanwhile, the shielding unit 230 is provided above the supporting plate 110. The shielding unit 230 shields the substrate from plumes/residence beams P/RB that are generated together with the shock waves SW.

In more detail, the shielding unit 230 may include a mask 231, a rotational driving unit 233, and a connection unit 235. The mask 231 is installed above and spaced apart from the supporting plate 110. At this point, a rear surface of the mask 231 faces the top surface of the supporting plate 110. The mask 231 is disposed between the supporting plate 110 and the focal point FP to shield the substrate from the plumes/residence beams P/RB.

In one embodiment, the mask 231 may be located at a side of the focal point FP and formed in a plate shape. In addition, the mask 231 may be formed of silicon.

In this embodiment, the mask 231 is formed in a circular shape. However, the present invention is not limited to this configuration. For example, the mask 231 may be formed in an oval shape.

The rotational driving unit 233 and the connection unit 235 are installed above the mask 231. The rotational driving unit 233 is a stepping motor providing the torque to the mask 231. The connection unit 235 is coupled to a top surface of the mask 231 and connects the mask 231 to the rotational driving unit 233.

The torque of the rotational driving unit 233 is transferred to the mask 231 via the connection unit 235. The mask 231 reciprocally rotates by the torque of the rotational driving unit 233. In one embodiment, a rotational angle of the mask 231 is less than 180°.

In more detail, the mask 231 includes first to fourth shielding regions 231a, 231b, 231c, and 231d. The first to fourth shielding regions 231a, 231b, 231c, and 231d are defined by lines crossing a central point of the mask 231. For example, the shielding regions 231a, 231b, 231c, and 231d are formed in an arc shape.

In this embodiment, the first to fourth shielding regions 231a, 231b, 231c, and 231d have a same central angle $\theta$ that is identical to a rotational angle of the mask 231. Therefore, the number of the first to fourth shielding regions 231a, 231b, 231c, and 231d may vary in accordance with the rotational angle $\theta$ of the mask 231. The rotational angle $\theta$ of the mask 231 is determined by rotational motion of the rotational driving unit 233. That is, when the rotational angle of the mask 233 is 45°, as shown in FIG. 2, the mask 231 is divided into four shielding regions 231a, 231b, 231c, and 231d and a central angle of each of the shielding regions 231a, 231b, 231c, and 231d is 45°.

During the cleaning of the substrate, the 45°, one of the first to fourth shielding regions 231a, 231b, 231c, and 231d is disposed adjacent to the focal point. In one embodiment, when viewed from a top plane, the shielding region adjacent to the focal point FP is disposed such that a line bisecting the central angle $\theta$ is located on an identical line to the focal point.

Since the mask 231 reciprocally rotates by the central angle $\theta$ during the cleaning of the substrate, the plumes/residence beams P/RB are mainly incident on the shielding region adjacent to the focal point FP. As described above, the shielding region adjacent to the focal point FP may be damaged. To prevent this, the mask 231 periodically changes the shielding region that is adjacent to the focal point FP.

As described above, since the shielding region adjacent to the focal point is periodically switched, the concentration of the plumes/residence beams P/RB on a specific portion of the mask 231 can be prevented. As a result, the cleaning unit 2001 prevents the damage of the mask 231 and thus prevents the recontamination of the substrate. Therefore, the cleaning efficiency can be improved.

In this embodiment, the mask 231 reciprocally rotates by the rotational angle $\theta$ during the cleaning of the substrate. However, the shielding region may be periodically switched without reciprocally rotating the mask 231. For example, the first shielding region 231a is first disposed adjacent to the focal point FP and the cleaning of the substrate is performed. When a predetermined time has elapsed, the driving unit 233 rotates the mask 231 such that the second shielding region 231b is disposed adjacent to the focal point FP, after which the cleaning of the substrate is performed. As described above, the rotational driving unit 233 rotates the mask 231 only when the shielding region adjacent to the focal point is switched.

Further, in this embodiment, the mask 231 may rotates or linearly moves by the rotational driving unit 233.

Meanwhile, the cleaning unit 201 may further include a suction unit 240 for sucking the foreign substances PC on the substrate and discharging the sucked foreign substances PC to an external side. The suction unit 240 is disposed above the supporting plate 110 to suck the foreign substances PC (i.e., particles) separated from the substrate by the shock waves SW.

The following will describe a substrate cleaning method using the cleaning unit 201 with reference to the accompanying drawings.

Figure 3:
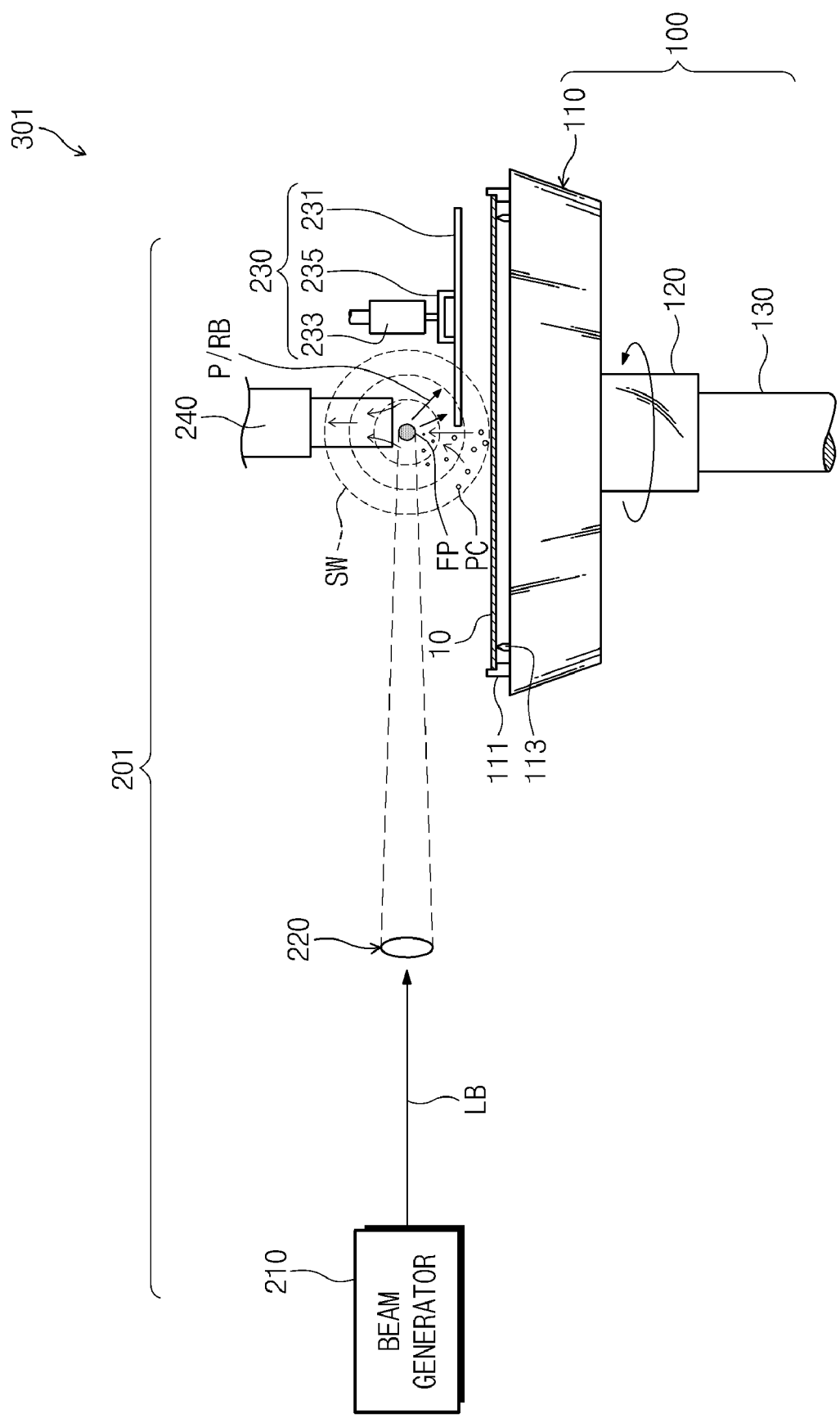
FIG. 3 is a schematic view illustrating a process for cleaning a substrate in the substrate cleaning apparatus of FIG. 1.
Figure 4:
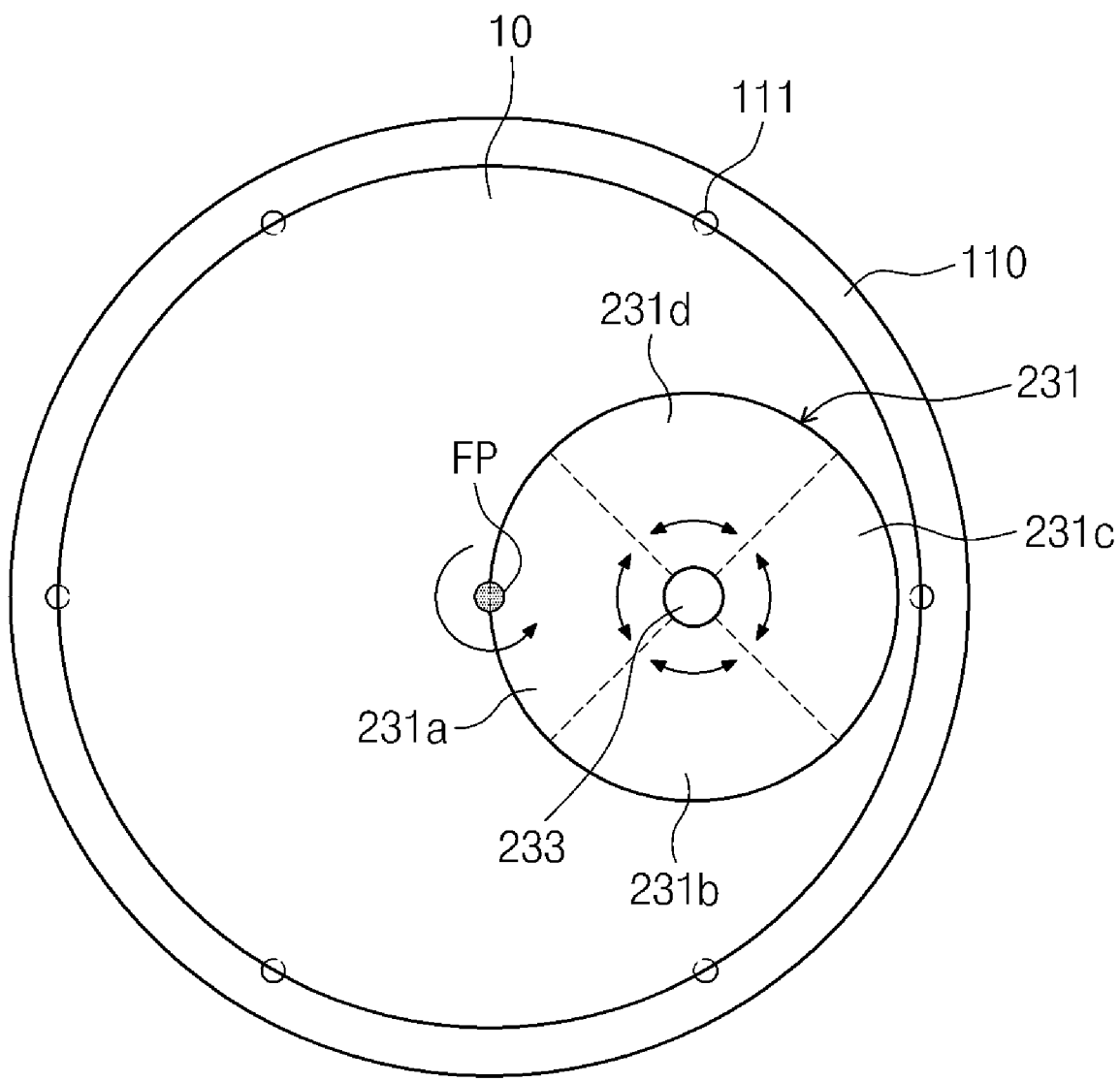
FIGS. 4 and 5 are top plane views illustrating a process for switching a shielding location of a mask depicted in FIG. 3.
Figure 5:
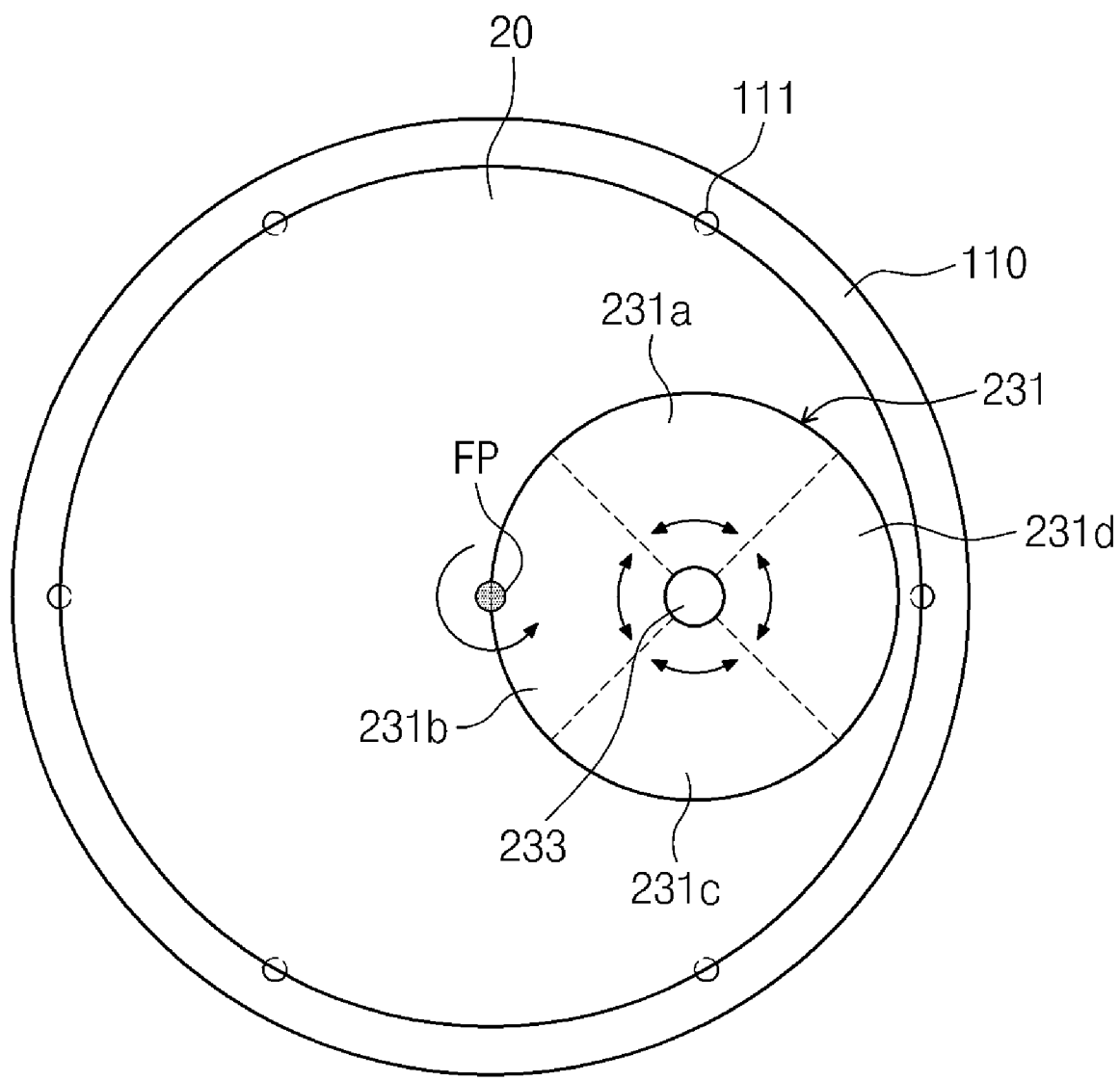

FIG. 3 is a schematic view illustrating a process for cleaning a substrate in the substrate cleaning apparatus of FIG. 1, and FIGS. 4 and 5 are top plane views illustrating a process for switching a shielding location of the mask depicted in FIG. 3.

Referring to FIGS. 3 and 4, the substrate 10 is first disposed on the supporting plate 110 and the substrate 10 on the supporting plate 110 rotates by rotating the rotational shaft 120.

The beam generator 210 generates the laser beams LB and directs the laser beams LB to the lens 220. The lens 220 focuses the laser beams LB on the top surface of the substrate 10 to generate the shock waves SW. The focal point FP of the lens 220 is located at a central point when viewed from a top plane.

The shock waves SW collide with the surface of the substrate 10 to separate the foreign substances PC from the substrate 10. The suction unit 240 sucks the foreign substances PC that are separated in the form of particles during the cleaning of the substrate 10 using the shock waves SW and discharges the sucked foreign substances PC to the external side.

During the cleaning of the substrate 10, the mask 231 shields the substrate 10 from the plumes/residence beams P/RB.

In more detail, when viewed from the top plane, the mask 231 is disposed at a side of the focal point FP while covering a part of the substrate 10. In addition, the mask 231 is spaced apart from the substrate 10 with a rear surface thereof opposing the substrate 10. During the cleaning of the substrate 10, the mask 231 reciprocally rotates by a predetermined rotational angle θ to shield the substrate 10 from the plumes/laser beams P/RB. At this point, the shielding region adjacent to the focal point FP is periodically sequentially switched.

For example, the mask 231 may switch the shielding region adjacent to the focal point FP whenever the substrate that will be cleaned is replaced. That is, as shown in FIG. 4, the cleaning unit 201 performs the cleaning of the substrate 10 disposed on the supporting plate 110 with the first shielding region 231a of the mask 231 disposed adjacent to the focal point FP. Subsequently, as shown in FIG. 5, when a new substrate 20 is disposed on the supporting plate 110, the cleaning unit 201 performs the cleaning of the new substrate 20 with the second shielding region 231b disposed adjacent to the focal point FP.

The switch of the shielding region may be realized in a predetermined time unit during the cleaning of the same substrate or in accordance with the accumulative number of the substrates cleaned.

Figure 6:
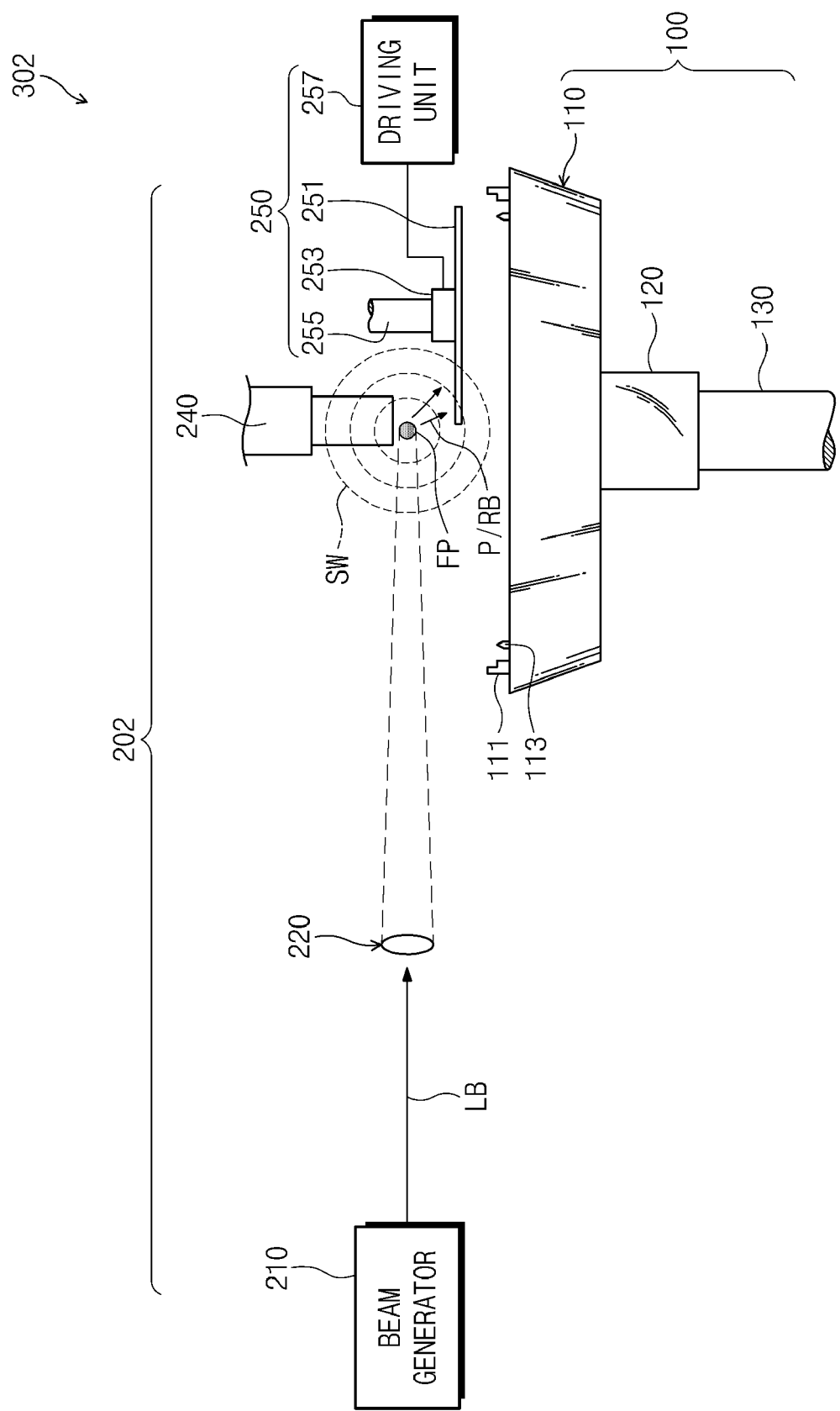
FIG. 6 is a schematic view of a substrate cleaning apparatus according to another embodiment of the present invention.
Figure 7:
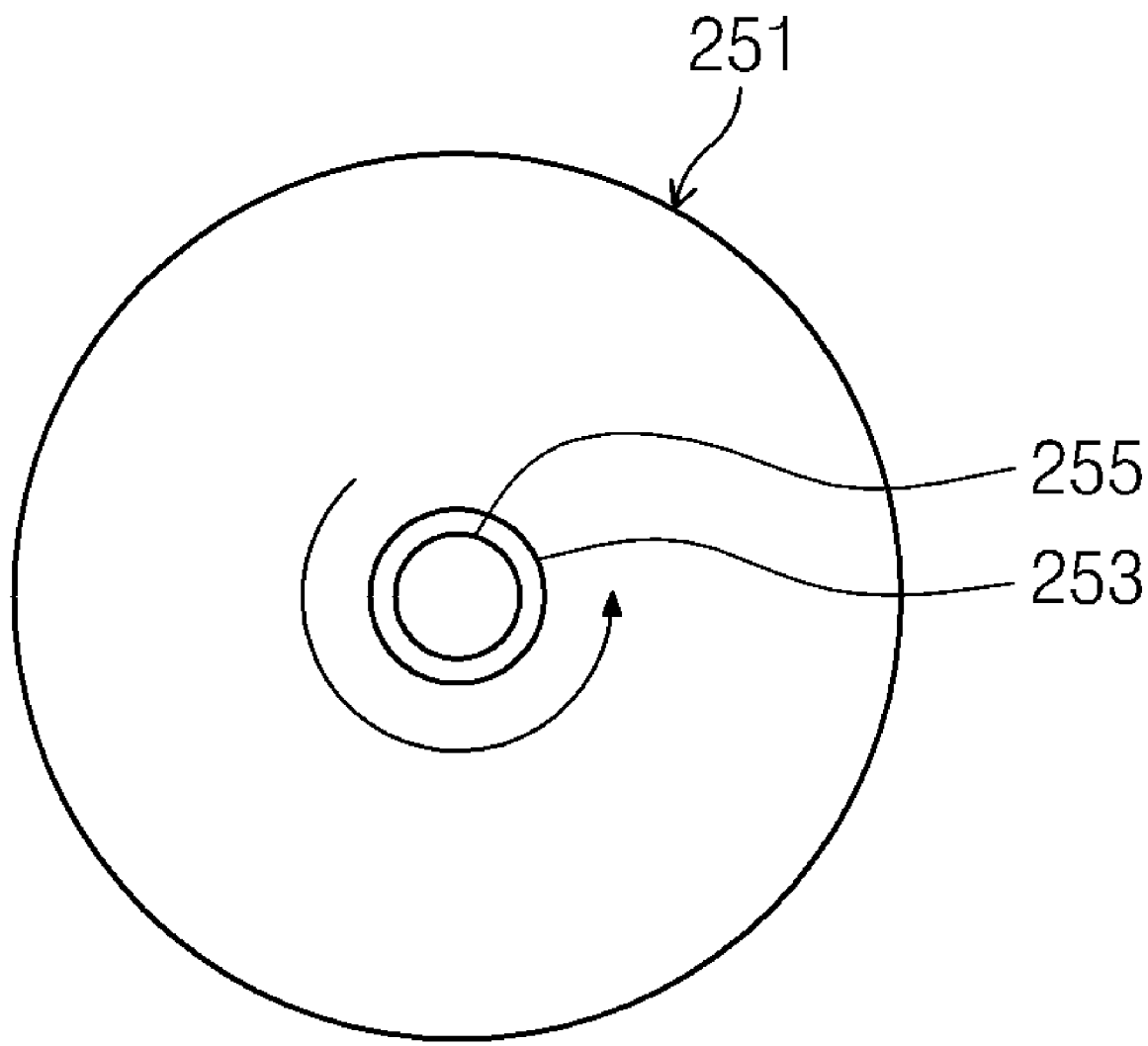
FIG. 7 is a top plane view of a shielding unit depicted in FIG. 6.

FIG. 6 is a schematic view of a substrate cleaning apparatus according to another embodiment of the present invention and FIG. 7 is a top plane view of the shielding unit depicted in FIG. 6.

Referring to FIGS. 6 and 7, a substrate cleaning apparatus 302 of this embodiment may include a supporting unit 100 supporting a substrate and a cleaning unit 202 generating shock waves SW for cleaning the substrate. Since the supporting unit 100 has a same structure as the supporting unit 100 of FIG. 1, a like reference numeral is assigned thereto and the detailed description thereof will be omitted herein.

The cleaning unit 202 generates the shock waves using laser beams LB. The cleaning unit 202 may include a beam generator 210 generating the laser beams LB, a lens 220 focusing the laser beams from the beam generator 210, and a shielding unit for shielding the substrate from plumes/residence beams P/RB.

The lens focuses the laser beams LB above the supporting unit 100 and thus the shock waves SW are generated above the supporting unit 100. In one embodiment, a focal point of the lens 220 is located above a central portion of the supporting plate 110 of the supporting unit 100. The focal point is fixed during the cleaning of the substrate using the shock waves SW.

The shielding unit 250 shields the substrate from the plumes/residence beams P/RB that are generated together with the shock waves SW. In more detail, the shielding unit 250 may include a mask 251, a rotational unit 253, a stationary unit 255, and a driving unit 257.

The mask 251 is disposed above the supporting plate 110 with a rear surface thereof opposing the supporting plate 110. The mask 251 is disposed between the supporting plate 110 and the focal point FP. In one embodiment, the mask 251 is positioned at a side of the focal point and formed in a plate shape. The mask 251 may be formed of silicon. The mask 251 is formed in a circular shape. However, the present invention is not limited to this configuration. For example, the mask 251 may be formed in an oval shape.

The mask 251 prevents the plumes/residence beams P/RB from being incident on the substrate on the supporting plate 110. That is, the plumes/residence beams P/RB spread with reference to the focal point and move toward the supporting plate 110, consequently, to the mask 251 adjacent to the supporting plate.

The rotational unit 253 is coupled to a top surface of the mask 251 and is further coupled to the stationary unit 255 to be capable of rotating. The rotational unit 253 is connected to the driving unit 257 and transfers torque from the driving unit 257 to the mask 251. At this point, the stationary unit 255 does not rotate together with the rotational unit 253. The mask 251 rotates together with the rotational unit 253. Therefore, the concentration of the plumes/residence beams P/RB on a specific region of the mask 251 can be prevented.

That is, the plumes/residence beams P/RB are mainly incident on a portion of the mask 251, which is adjacent to the focal point FP. Therefore, when the substrate is cleaned while rotating the mask 251, the portion of the mask 251, which is adjacent to the focal point FP, continuously varies and thus the portion on which the plume/residence beams P/RB is incident can be dispersed.

As described above, the shielding unit 250 prevents the concentration of the plumes/residence beams P/RB on the specific region of the mask 251 by rotating the mask 251. Accordingly, the shielding unit 250 prevents the damage of the mask 251 and thus prevents the recontamination of the substrate by the damage of the mask 251, thereby improving the cleaning efficiency.

In this embodiment, during the cleaning of the substrate, the mask 251 keeps rotating in one direction. However, it is also possible during the cleaning of the substrate that the driving unit 257 does not continuously rotate the mask 251 but rotates the mask at an angle less than 360° every predetermined unit time to periodically switch the portion of the mask, which is adjacent to the focal point FP.

Meanwhile, the cleaning unit 202 may further include a suction unit 240 for sucking the foreign substances PC that are separated from the substrate by the shock waves SW. Since the suction unit 240 is same as the suction unit 240 of FIG. 1, a like reference numeral is assigned thereto and the detailed description thereof will be omitted herein.

The following will describe a substrate cleaning method using the cleaning unit 202 with reference to the accompanying drawings.

Figure 8:
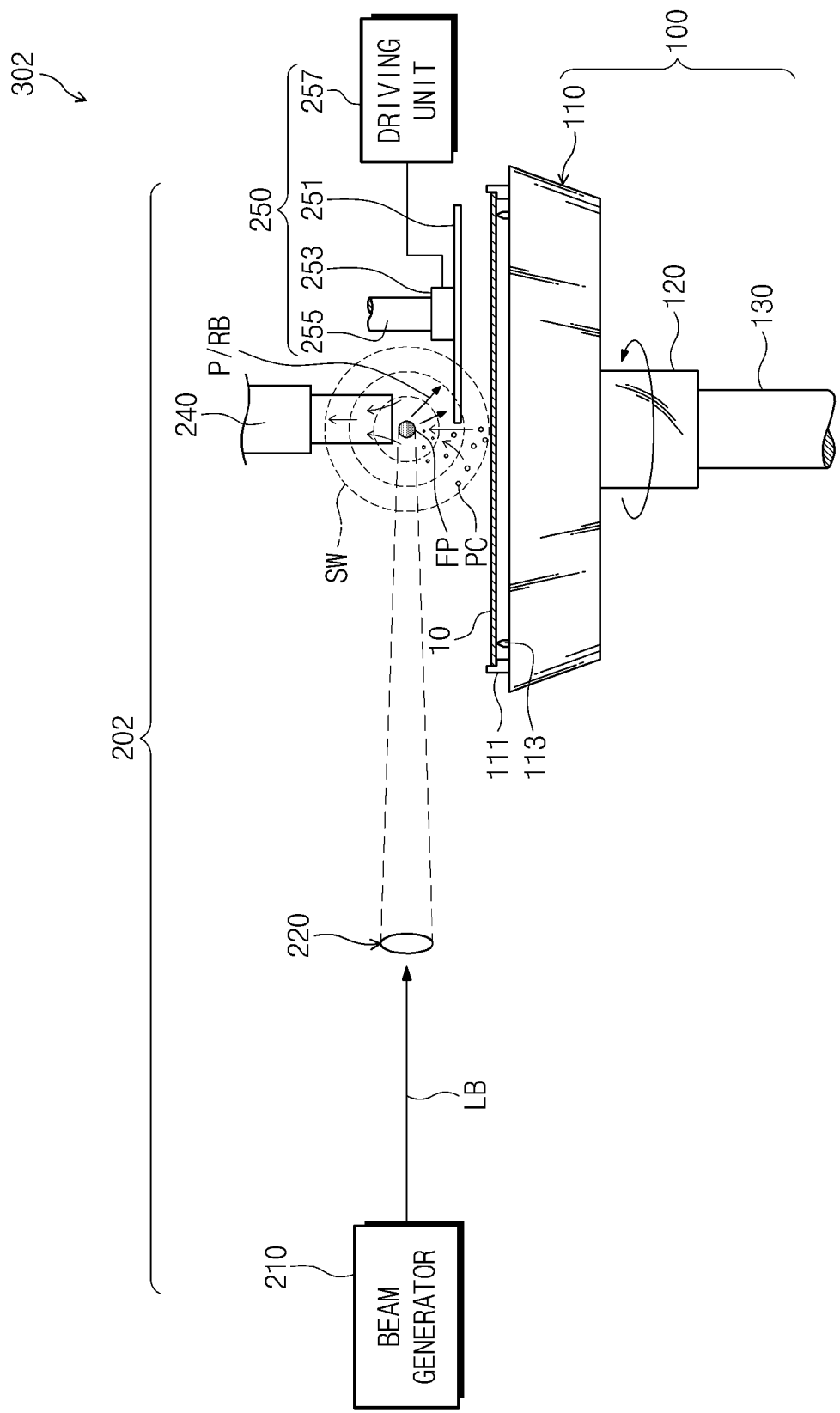
FIG. 8 is a schematic view illustrating a process for cleaning a substrate in the substrate cleaning apparatus of FIG. 6.
Figure 9:
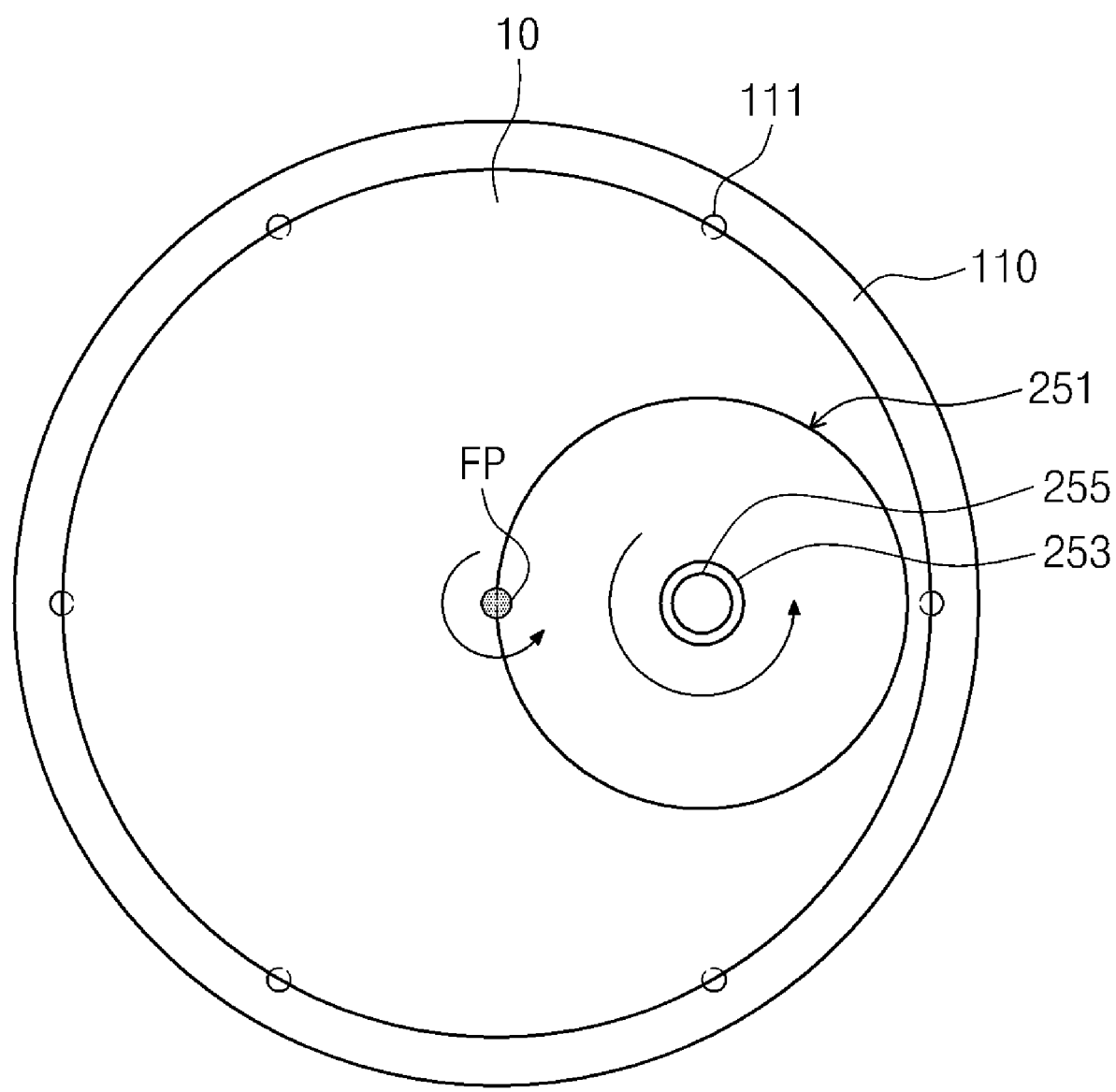
FIG. 9 is a top plane view of a shielding unit depicted in FIG. 8.

FIG. 8 is a schematic view illustrating a process for cleaning a substrate in the substrate cleaning apparatus of FIG. 6, and FIG. 9 is a top plane view of the shielding unit depicted in FIG. 8.

Referring to FIGS. 8 and 9, the substrate 10 is first disposed on the supporting plate 110 and the substrate 10 on the supporting plate 110 rotates by rotating the rotational shaft 120.

The beam generator 210 generates the laser beams LB and directs the laser beams LB to the lens 220. The lens 220 focuses the laser beams LB above the substrate 10 to generate the shock waves SW. The focal point FP of the lens 220 is located at a central point when viewed from a top plane.

The shock waves SW collide with the surface of the substrate 10 to separate the foreign substances PC from the substrate 10. The suction unit 240 sucks the foreign substances PC that are separated in the form of particles during the cleaning of the substrate 10 using the shock waves SW and discharges the sucked foreign substances PC to the external side.

During the cleaning of the substrate 10, the mask 251 shields the substrate 10 from the plumes/residence beams P/RB.

In more detail, when viewed from the top plane, the mask 251 is disposed at a side of the focal point FP while covering a part of the substrate 10. In addition, the mask 251 is spaced apart from the substrate 10 with a rear surface thereof opposing the substrate 10. During the cleaning of the substrate 10 using the shock waves SW, the mask 251 keeps rotating in one direction while preventing the plumes/laser beams P/RB from being incident on the substrate 10.

As described above, since the cleaning of the substrate 10 is realized as the mask 251 keeps rotating, the concentration of the plumes/laser beams P/RB on a specific region of the mask 251 can be prevented. Accordingly, the cleaning unit 202 prevents the damage of the mask 251 and thus further prevents the recontamination of the substrate 10 by the damage of the mask 251.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate cleaning apparatus comprising:
   a rotatable supporting plate supporting a substrate thereon;
   a beam generator to generate laser beams;
   a lens focusing the laser beams from the beam generator to generate shock waves above the supporting plate with reference to a focal point of the lens above the substrate, the beams colliding with a surface of the substrate to remove foreign substances therefrom; and
   a shielding unit protecting the substrate the shielding unit including a generally circular mask located above the substrate surface but below the focal point and a moving unit coupled to the mask for periodically rotating a different shielding region of the mask so as to be adjacent to the focal point,
   the mask positioned, when viewed from the top plane, at a side of a line bisecting the substrate by crossing the central point of the substrate.

2. The apparatus of claim 1, wherein the mask has a circular plate shape or oval shape.

3. The apparatus of claim 1, wherein the mask is divided into a plurality of shielding regions arranged so as to be adjacent to the focal point by at least one line crossing a central point of the mask, central angles of each shielding region being equal, the central angle equaling the rotational angle of the mask.

4. The apparatus of claim 1, wherein the moving unit further includes:
   a connection unit coupled to a top surface of the mask; and
   a rotational driving unit coupled to the connection unit for rotating the mask.

5. The apparatus of claim 1, wherein the moving unit further includes:
   a rotational unit coupled to a top surface of the mask for rotating the mask; and
   a stationary unit coupled to the rotational unit.

6. The apparatus of claim 1, further comprising a suction unit adjacent to the shielding unit above the substrate for sucking particles.

7. The apparatus of claim 1, wherein the moving unit periodically rotates a shielding region of the mask by a specific angle to avoid a buildup of plumes and residence beams on a specific portion of the mask thereof.

8. The apparatus of claim 1, wherein the moving unit periodically rotates a shielding region of the mask after a predetermined timing to avoid a buildup of plumes and residence beams on a specific portion of the mask thereof.

9. A substrate cleaning apparatus, comprising:
   a rotatable supporting plate supporting a substrate thereon;
   a beam generator to generate laser beams;
   a lens focusing laser beams from the beam generator to generate shock waves with reference to a focal point of the lens above the substrate;
   a generally circular mask located above the substrate surface but below the focal point and positioned, when viewed from the top plane, at a side of a line bisecting the substrate by crossing the central point of the substrate, the mask having a plurality of different shielding regions, the mask periodically rotatable to bring a different shielding region of thereof adjacent to the focal point to avoid a buildup of plumes and residence beams on a specific portion of the mask thereof.

* * * * *